(12) United States Patent
Morrill et al.

(10) Patent No.: US 10,245,727 B2
(45) Date of Patent: Apr. 2, 2019

(54) AUTOMATED DATA CENTER

(71) Applicant: CenturyLink Intellectual Property LLC, Denver, CO (US)

(72) Inventors: Robert J. Morrill, Overland Park, KS (US); Jared E. Wray, Bellevue, WA (US)

(73) Assignee: CenturyLink Intellectual Property LLC, Broomfield, CO (US)

( * ) Notice: Subject to any disclaimer, the term of this patent is extended or adjusted under 35 U.S.C. 154(b) by 0 days.

(21) Appl. No.: 15/936,883

(22) Filed: Mar. 27, 2018

(65) Prior Publication Data

US 2018/0215041 A1    Aug. 2, 2018

Related U.S. Application Data

(63) Continuation of application No. 15/425,641, filed on Feb. 6, 2017, now Pat. No. 9,943,960, which is a continuation of application No. 14/704,583, filed on May 5, 2015, now Pat. No. 9,597,801.

(60) Provisional application No. 62/066,772, filed on Oct. 21, 2014.

(51) Int. Cl.
| | |
|---|---|
| *B25J 9/00* | (2006.01) |
| *B25J 9/16* | (2006.01) |
| *G11B 17/22* | (2006.01) |
| *B25J 5/02* | (2006.01) |
| *G11B 15/68* | (2006.01) |

(52) U.S. Cl.
CPC ............... *B25J 9/1666* (2013.01); *B25J 5/02* (2013.01); *B25J 9/0093* (2013.01); *G11B 15/6885* (2013.01); *G11B 17/22* (2013.01); *Y10S 901/02* (2013.01)

(58) Field of Classification Search
USPC .................................................. 700/245–264
See application file for complete search history.

(56) References Cited

U.S. PATENT DOCUMENTS

| | | | | |
|---|---|---|---|---|
| 4,645,411 | A * | 2/1987 | Madwed ................. | B25J 15/02 198/468.2 |
| 4,674,948 | A * | 6/1987 | Hornacek ................. | B25J 5/02 414/269 |
| 6,681,151 | B1* | 1/2004 | Weinzimmer ......... | B25J 9/1697 219/121.85 |

(Continued)

*Primary Examiner* — Jonathan L Sample
(74) *Attorney, Agent, or Firm* — Adsero IP

(57) ABSTRACT

An automated data center management system includes one or more equipment racks housing at least one server farm equipment, each of the at least one server farm equipment having a respective attachment point, a spare equipment repository having at least one replacement equipment, and a hardware management robot. The hardware management robot includes a robotic arm having an interface point, the interface point configured to couple to the attachment point. A hardware management controller is communicates with the hardware management robot, the hardware management controller including at least one processor, and non-transitory computer readable media having encoded thereon computer software comprising a set of instructions to receive a service request indicating a server farm equipment needing service, determine a location of the server farm equipment, generate a path to the location of the server farm equipment, and transmit the path to the hardware management robot.

20 Claims, 8 Drawing Sheets

(56) References Cited

U.S. PATENT DOCUMENTS

| | | | | |
|---|---|---|---|---|
| 7,072,739 B2* | 7/2006 | Bash | .................... | G05D 1/0246 |
| | | | | 700/245 |
| 7,313,464 B1* | 12/2007 | Perreault | ................ | B25J 9/1666 |
| | | | | 318/568.1 |
| 7,725,212 B2* | 5/2010 | Prasse | .................... | B25J 5/007 |
| | | | | 700/214 |
| 9,463,574 B2* | 10/2016 | Purkayastha | .......... | B25J 9/1697 |
| 9,597,801 B2 | 3/2017 | Morrill et al. | | |
| 9,908,239 B1* | 3/2018 | O'Brien | ................ | B25J 9/1666 |
| 9,943,960 B2 | 4/2018 | Morrill et al. | | |
| 2003/0016504 A1* | 1/2003 | Raynham | ............. | G11B 33/126 |
| | | | | 361/727 |
| 2004/0243280 A1* | 12/2004 | Bash | .................... | G05D 1/0246 |
| | | | | 700/245 |
| 2007/0219668 A1* | 9/2007 | Takahashi | ............. | B25J 9/1612 |
| | | | | 700/249 |
| 2009/0067971 A1* | 3/2009 | Chadwick | ............. | B65H 49/16 |
| | | | | 414/680 |
| 2009/0192647 A1* | 7/2009 | Nishiyama | ............. | B25J 9/0003 |
| | | | | 700/215 |
| 2011/0098859 A1* | 4/2011 | Irie | ........................ | B25J 9/1687 |
| | | | | 700/259 |
| 2011/0245960 A1* | 10/2011 | Suzuki | ............... | G11B 15/6835 |
| | | | | 700/218 |
| 2012/0158180 A1* | 6/2012 | Iio | .......................... | B25J 9/1679 |
| | | | | 700/259 |
| 2012/0165979 A1* | 6/2012 | Lim | ........................ | B25J 9/162 |
| | | | | 700/253 |
| 2013/0054030 A1* | 2/2013 | Murakami | ............. | B25J 9/1612 |
| | | | | 700/259 |
| 2013/0138244 A1* | 5/2013 | Nagasaka | ............. | B25J 9/0087 |
| | | | | 700/245 |
| 2013/0138804 A1* | 5/2013 | Hsien | ................. | H04L 12/6418 |
| | | | | 709/224 |
| 2013/0231779 A1* | 9/2013 | Purkayastha | .......... | B25J 9/1697 |
| | | | | 700/259 |
| 2013/0310980 A1* | 11/2013 | Matsuoka | ............ | B25J 15/0023 |
| | | | | 700/260 |
| 2014/0067127 A1* | 3/2014 | Gotou | .................... | B25J 9/1697 |
| | | | | 700/259 |
| 2014/0074291 A1* | 3/2014 | Emoto | .................. | B25J 9/1664 |
| | | | | 700/258 |
| 2014/0234066 A1* | 8/2014 | Mathi | .................. | B25J 15/0616 |
| | | | | 414/752.1 |
| 2014/0316572 A1* | 10/2014 | Iwatake | ................. | B25J 9/1633 |
| | | | | 700/258 |
| 2015/0232273 A1* | 8/2015 | Jau | .......................... | H04L 67/16 |
| | | | | 700/218 |
| 2015/0274421 A1* | 10/2015 | Yamada | ............... | B65G 1/0492 |
| | | | | 700/218 |
| 2015/0290808 A1* | 10/2015 | Renkis | .................. | H04N 7/181 |
| | | | | 700/257 |
| 2015/0336274 A1* | 11/2015 | Connell, II | ............ | B25J 9/1697 |
| | | | | 700/259 |
| 2016/0016311 A1* | 1/2016 | Konolige | ................ | B25J 5/007 |
| | | | | 700/245 |
| 2016/0107312 A1 | 4/2016 | Morrill et al. | | |
| 2017/0144305 A1 | 5/2017 | Morrill et al. | | |

\* cited by examiner

AUTOMATED DATA CENTER

CROSS-REFERENCES TO RELATED APPLICATIONS

This application is a continuation application of U.S. application Ser. No. 15/425,641 filed Feb. 6, 2017 by Robert J. Morrill, entitled, "Automated Data Center", which is a continuation application of U.S. application Ser. No. 14/704,583 (now U.S. Pat. No. 9,597,801) filed May 5, 2015 by Robert J. Morrill, entitled, "Automated Data Center", which claims priority to U.S. Provisional Patent Application Ser. No. 62/066,772 (the "'772 Application"), filed on Oct. 21, 2014 by Robert J. Morrill, entitled, "Automated Data Center," the disclosure of which is incorporated herein by reference in its entirety and for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to server farm management, and more particularly to systems and methods for automating the management of data centers and related equipment.

BACKGROUND

As cloud data, applications, systems, and infrastructure services have become more ubiquitous, data centers, server farms, and server clusters have correspondingly increased in size and complexity. Data centers, server farms, and server clusters typically consist of thousands of computers, routers, power supplies, and other related equipment mounted on equipment racks. Because of the large number of servers in a typical server farm, hardware failures commonly occur. Server farms often employ backup servers and other equipment for use in the event of a failure to ensure the availability of the services provided by the servers.

Even though system redundancies may be in place, failed equipment must eventually be removed and replaced. In conventional data centers and server farms, this is accomplished manually by a human technician or other personnel. This, in turn, impacts mean-time-to-repair and minimum-time-to-repair metrics of the data center or server farm.

In the realm of computer storage, tape libraries are employed to store large amounts of data. Tape libraries often comprise a plurality of shelves or slots that hold many tape cartridges. Depending on the size of the tape libraries and the type of tape cartridges used, the number of tape cartridges in a single library could range from a few tape cartridges to several thousands. Tape cartridges are sorted and labeled for retrieval individual retrieval when data stored on the tape cartridges need to be accessed. Until this process was automated, tape cartridge placement and retrieval was a manual process performed by a human.

Conventional tape libraries automate this process, using robotic means to retrieve, and replace tape cartridges. This has significantly cut down on the costs of tape library storage, as well as improved access times for accessing data in the tape library. However, the robotic means are typically self-contained within a tape library unit. Each tape library has its own respective robotic means for accessing and managing its respective set of tape cartridges, with no way for a robotic tape cartridge accessing mechanism to access tapes in another tape library unit.

Thus, a way to automate data center management while avoiding the need for manual server farm equipment replacement is provided below.

BRIEF SUMMARY

According to a set of embodiments, a system, apparatus, and method for automating the management of a data center is provided.

The tools provided by various embodiments include, without limitation, methods, systems, and/or software products. Merely by way of example, a method might comprise one or more procedures, any or all of which are executed by a computer system. Correspondingly, an embodiment might provide a computer system configured with instructions to perform one or more procedures in accordance with methods provided by various other embodiments. Similarly, a computer program might comprise a set of instructions that are executable by a computer system (and/or a processor therein) to perform such operations. In many cases, such software programs are encoded on physical, tangible, and/or non-transitory computer readable media (such as, to name but a few examples, optical media, magnetic media, and/or the like).

In one aspect, an automated data center management system includes one or more equipment racks, each equipment rack configured to house at least one server farm equipment, each of the at least one server farm equipment having a respective attachment point. A spare equipment repository is provided having at least one replacement equipment. A hardware management robot includes a robotic arm having an interface point, the interface point configured to couple to the attachment point. A hardware management controller in communication with the hardware management robot includes at least one processor, and non-transitory computer readable media having encoded thereon computer software comprising a set of instructions executable by the at least one processor to perform one or more operations. The set of instructions includes instructions to receive a service request, wherein the service request indicates a server farm equipment needing service. The set of instructions further include instructions to determine a location of the server farm equipment, instructions to generate a path to the location of the server farm equipment, and instructions to transmit the path to the hardware management robot. In response to receiving the path, the hardware management robot is configured to follow the path to the server farm equipment and replace the server farm equipment.

In one set of embodiments, the automated data center management system may further include a track, wherein the hardware management robot is operably coupled to the track. In various embodiments, the track may be coupled to the ceiling or floor of the floor of the data center. In further embodiments, the may be a linear track through the data center, or be arranged in a looped configuration. The track may further include one or more track junctions joining a main segment of the track to at least one secondary segment of the track, wherein the track junction is configured to allow the hardware management robot select whether to traverse the main segment or one of the at least one secondary segment.

In some embodiments, the path may include a return path from the location of the server farm equipment, wherein the path further includes an alternate return path configured to allow the hardware management robot to avoid obstructions along the return path. The alternate return path may guide the hardware management robot to a conveyor belt position, wherein the conveyor belt is configured to carry recovered equipment to a failed equipment service area.

In further embodiments, the interface point may be interchangeable, and wherein the set of instructions may further include instructions to identify an attachment point of the server farm equipment, and instructions to determine an interface point for use by the hardware management robot based on the attachment point of the server farm equipment. The interface point may be chosen from a set of interchangeable interface points including at least a screw-type, magnetic-type, suction-type, hook-type, finger-type, or clamp-type interface point. The set of instructions may further include instructions to identify, based on the request, replacement equipment available in the spare equipment repository with which to replace the server farm equipment the set of instructions further comprises instructions to create an indicator with which to tag recovered equipment. In further embodiments, the server farm equipment may be associated with a tag, barcode, or label, wherein the hardware management robot may operate to read the tag, barcode, or label to identify the server farm equipment based on the tag, barcode, or label. The tag may include a radio frequency identification handle or near-field communication chip.

In another aspect, a method for automating a data center is provided. A hardware management controller may receive a request to service a server farm equipment. The hardware management controller may determine a location of the server farm equipment based on the request, generate a path to the location of the server farm equipment, and transmit the path to a hardware management robot. The hardware management robot may include a robotic arm having an interface point, the interface point configured to couple to an attachment point of the server farm equipment. The hardware management robot may receive the path from the hardware management controller, traverse the path to the location of the server farm equipment, and replace the server farm equipment with replacement equipment.

In one set of embodiments, the interface point may be interchangeable. Thus, the method may further include identifying a type of attachment point used by the server farm equipment, and determining an interface point that corresponds to the attachment point. In some embodiments, the method may further include identifying replacement equipment available in a spare equipment repository with which to replace the server farm equipment, and retrieving the replacement equipment from the spare equipment repository. In further embodiments, the path may include a return path back to a return position. In such embodiments, the method may further include generating an alternate return path configured to allow the hardware management robot to avoid obstructions along the return path, determining that an obstruction is blocking the return path, and utilizing the alternate return path to in response to determining the return path is blocked.

In yet another aspect, an automated data center hardware management controller is provided. The automated data center hardware management controller may include at least one processor, and non-transitory computer readable media having encoded thereon computer software comprising a set of instructions executable by the at least one processor to perform one or more operations. The set of instructions may include instructions to receive a service request indicating a server farm equipment needing service, determine a location of the server farm equipment, generate a path to the location of the server farm equipment, and transmit the path to a hardware management robot. The hardware management robot may be configured to follow the path to the server farm equipment and replace the server farm equipment.

In some embodiments, the set of instructions may further include instructions to identify an identifier of the server farm equipment farm equipment needing service based on the service request. The location of the server farm equipment may be determined based on the identifier of the server farm equipment. In another embodiment, the interface point of the hardware management robot may be interchangeable. In this embodiment, the set of instructions may further include instructions to identify an attachment point of the server computer, and determine an appropriate interface point to couple to the attachment point.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

While various aspects and features of certain embodiments have been summarized above, the following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

The accompanying descriptions of FIGS. 1-7 are provided for purposes of illustration and should not be considered to limit the scope of the different embodiments. FIGS. 1-7 may refer to examples of different embodiments corresponding various stages and components of the captive portal service offering system, which can be considered alternatives or which can be used in conjunction with one another in the various embodiments.

Figure 1:
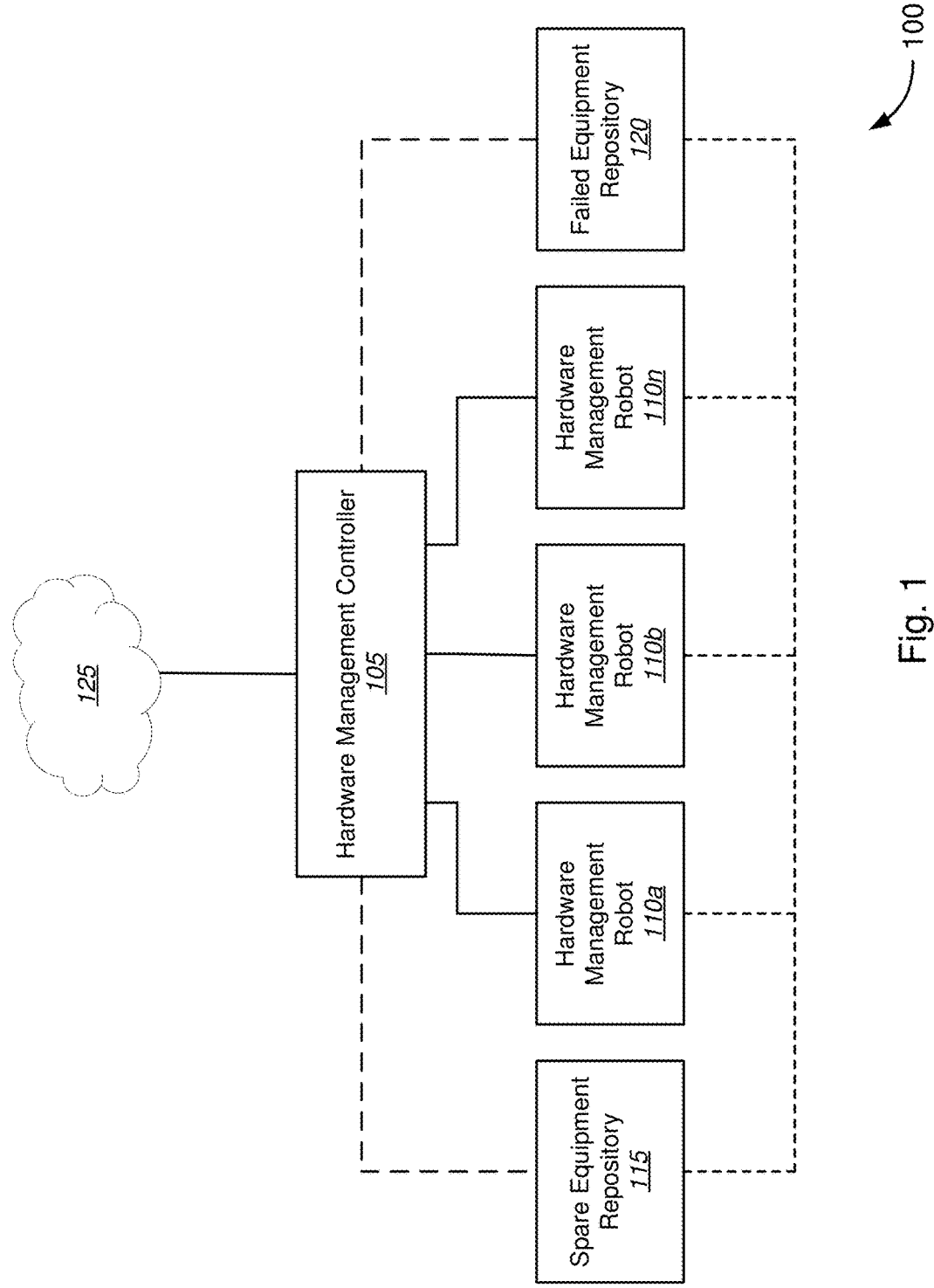
FIG. 1 is a hardware block diagram of an automated data center, in accordance with various embodiments.

FIG. 1 is a hardware block diagram of an automated data center 100, in accordance with various embodiments. According to one set of embodiments, the automated data center 100 may include, without limitation, a hardware management controller 105, a plurality of hardware management robots 110*a*, 110*b*, 110*n* (110 collectively), a spare equipment repository 115, and a failed equipment repository 120. In various embodiments, the hardware management controller 105 may be a computer system, server, or other like device operable to communicate with at least one hardware management robot 110, and to receive instructions or requests via network 125. In some embodiments, the hardware management controller 105 may also optionally communicate with the spare equipment repository 115, and failed equipment repository 120. Each of the spare equipment repository 115 and failed equipment repository 120 may also optionally be in communication with the hardware management robots 110.

In various embodiments, the hardware management controller 105 may be configured to receive instructions or requests via network 125. The instructions or requests may include, without limitation, a service request for a specific piece of equipment or multiple pieces of equipment. Server farm equipment may include any of the devices found in the data center, including, but no limited to, server computers, routers, network interface devices, gateway devices, digital subscriber line access multiplexers (DSLAM), cable modem termination system (CMTS), broadband remote access servers (BRAS), other edge devices, and other like devices. The instructions or requests may be received by the hardware management controller 105 from a diagnostic computer or other device that may be located remotely away from the server farm or data center 100, within the data center 100, or in a different part of the server farm or data center 100. For example, according to some embodiments, the diagnostic computer may be an off-site computer from which a technician or third-party, such as a customer, may report a problem or request repair service. In various embodiments, the diagnostic computer may determine a problem with an application or service, provided to the customer by the data center 100, based on performance metrics, other measures of quality of service (QoS), or a fault condition of equipment in the data center 100. The diagnostic computer may further identify the specific server computer or multiple server computers associated with the application or service.

In alternative embodiments, an on-site diagnostic computer or other device may report a problem or request repair service. The on-site diagnostic computer or other device may include, without limitation, a central dedicated computer in communication with some or all of the server computers and other equipment in the data center. In some embodiments, the on-site diagnostic computer may be associated with one or more equipment racks of a data center and configured to monitor QoS provided by server computers and other devices at the one or more equipment racks that are associated with the on-site diagnostic computer. Alternatively, the server computers and other devices of the data center may themselves be in communication with the hardware management controller 105 and may self-diagnose problems. Thus, the server computer or other devices may throw a fault condition or request service directly from the hardware management controller 105. In other embodiments, the hardware management controller 105 may itself act as a diagnostic computer.

When instructions, such as a service request, are received by the hardware management controller 105, the hardware management controller 105 may determine from the request a location of an associated server computer, multiple server computers, or other associated devices. For example, in some embodiments, the request for service may identify the server computer via a unique identifier of the server computer. The location of the various server computers and other server farm equipment in a data center may be kept in a database, index, or list accessible by the hardware management controller 105. Thus, the hardware management controller 105 may determine a location of the server computer in the data center by searching for the unique identifier and finding associated location information. In various embodiments, equipment racks, and slots on equipment racks, may be numbered or associated with the unique identifier of the server computer. Accordingly, location information may include, without limitation, geographic coordinates, equipment rack identifier, and position on an equipment rack.

According to one set of embodiments, based on the location information of the server computer or other equipment needing service, the hardware management controller 105 may generate a path to the server computer for hardware management robots 110 to follow. In various embodiments, the hardware management robots 110 may include, but are not limited to, robotic arms, wheeled robots, rotary and other airborne robots, walking-type robots, continuous-track robots (i.e. track-belt driven), or other robotic devices capable of physically navigating to a location specified by the location information, and removing and replacing server computers or other equipment from an equipment rack. In some embodiments, the hardware management robots 110 may be attached to a track, while in others, the hardware management robots 110 may freely navigate around the data center 100. In embodiments utilizing a track, the track may be placed on, or built into either a floor or ceiling of the data center 100. Tracks may include, but are not limited to, rail-based tracks, grooves in the floor or ceiling, a guided path such as electrified wire or magnetic tape (capable of being followed by the hardware management robots 110), and other suitable track configurations as will be known to those skilled in the art.

In one set of embodiments, the data center 100 may be a room or area within a brick-and-mortar type server farm. Similarly, the spare equipment repository 115, and failed equipment repository 120 may be a room or area within the server farm, or part of the data center 100. Thus, the equipment racks, server farm equipment, replacement equipment, tracks, hardware management robots 110, and hardware management controller(s) 105 may all be secured to, stored, housed in, or otherwise placed within the confines of the data center.

In another set of embodiments, the data center 100 may be a modular-type of data center. For example, in various embodiments, a modular data center 100 may comprise, without limitation, a modular container. In various embodiments, the modular container may include, without limitation, a shipping container, freight container, intermodal container, trailer, boxcar, shipping crate, and the like. However, it is to be understood that the modular container is not limited to any particular form factor. Each modular container may be a self-contained unit configured to run until the end of its useful life, having walls, a floor, and a ceiling. Modular data centers 100 may be moved around as needed, and replaced as they become obsolete, or reach the end of their operational life. Each modular unit may comprise their own respective equipment racks, server farm equipment, replacement equipment, tracks, a spare equipment repository 115, failed equipment repository 120, hardware management robots 110, and hardware management controller(s) 105. In some embodiments, the modular data centers 100 may further include their own respective power source, such as a generator. In other embodiments, the modular data centers 100 may rely on an external power source. Thus, the tracks and equipment racks may be secured to the ceiling, floor, and walls of the modular container. Furthermore, the spare equipment repository 115, and failed equipment repository 120 may be separately defined areas within the modular container.

In a further set of embodiments, the hardware management robots 110 may also utilize cameras, temperature sensors, scanners (e.g. barcode scanners), and other like attachments for the hardware management robots 100. The attachments may be removable (i.e. temporary), interchangeable, or permanently attached the hardware management robots 110. In various embodiments, the hardware management robots 110 may utilize the attachments to scan and identify server farm equipment. Individual pieces of server farm equipment may be associated with a tag, barcode, or other form of labeling that may be used to uniquely identify the server farm equipment. In some embodiments, the labeling may in itself constitute a unique identifier, whereas in other embodiments, the labeling may be associated with a separate unique identifier associated with the particular piece of equipment. In some embodiments, the attachments may be used to provide a technician with a video feed from the hardware management robot 110. In yet further embodiments, the attachments may aid in the functionality of the hardware management robot 110 as will be discussed in further detail below.

According to another set of embodiments, the hardware management robots 110 may further include an interchangeable "hand" or interface point allowing the hardware management robot 110 to reach, grab, attach, couple, or otherwise physically interact with the server farm equipment being replaced. The interface point of a hardware management robot 110 may include, without limitation, hooks, screwdrivers, clamps, suction cups, magnets, fingers, and other like structures. In various embodiments, the interface point may correspond to one or more types of attachment points for the particular server farm equipment. In some embodiments, server farm equipment may be modified to have attachment points added, or in other cases, attachment points may simply be existing physical features of the server farm equipment that the hardware management robot 110 may utilize for coupling with the interface point. For example, in one set of embodiments, server computers may have attachment points cut out of their housing where an interface point, such as hooks or fingers, may be secured. In another set of embodiments, a server computer may have a case that exhibit particular physical contours, such as indentations. A finger-type or clamp-type interface point may then be utilized to securely attach to the physical contours of the server computer case. Similarly, if the physical features of the server computer case provide for a smooth, broad surface, a suction-type interface point may be utilized instead, where fingers or a clamp-type interface point may not be able to adequately secure such cases.

In various embodiments, the spare equipment repository 115 may store replacement equipment with which to replace server farm equipment. The spare equipment repository 115 may include a storage room, table, equipment rack, or other defined area of the server farm or data center suitable for storage of replacement equipment. In some embodiments, the spare equipment repository 115 may be in communication with the hardware management controller 105, as depicted in phantom lines, or hardware management robots 110. In one set of embodiments, the spare equipment repository 115 may keep track of inventory in the spare equipment repository 115 in the form an electronic database, index, or list. Thus, the spare equipment repository 115 may indicate to the hardware management controller 105 or hardware management robot 110 whether particular replacement equipment was available, an inventory of all available replacement equipment, and keep track of changes to equipment inventory. Similarly, the failed equipment repository 120 may include a storage room, equipment rack, or service area. Thus, replaced, defective, or failed equipment may be returned by the hardware management robot 110 to the failed equipment repository 120 Like the spare equipment repository 115, in some embodiments, the failed equipment repository may communicate with the hardware management controller 105, the hardware management robots 110, or both. The failed equipment repository 120 may also keep an inventory of the replaced equipment, and track changes to its inventory, such as, for example, when repairs have been completed and the replaced equipment is removed from the failed equipment repository.

According to one set of embodiments, a customer or technician may submit a service request. In various embodiments, the service request may identify the customer or service affected. The hardware management controller 105 may receive the service request, and based on the request, may determine server farm equipment, such as a server computer, associated with the customer or service affected. In some embodiments, the hardware management controller 105 may determine, from the service request, a unique identifier of the particular server farm equipment, such as a tag, barcode, or other label. Alternatively, the hardware management controller 105 may generate location information indicating the location of the associated server farm equipment. The hardware management controller 105 may then transmit instructions to one or more of the hardware management robots 110. According to one set of embodiments, the hardware management controller 105 may use the location information to generate a path to the identified server farm equipment. In various embodiments, the path may correspond to a particular route taken along a track. For example, in some embodiments, the track may be a linear track through data center. In other embodiments, the track may be continuously looped, or have a tree-branch structure. Thus, the path may indicate the route to be taken along the track to reach the identified server farm equipment. In further embodiments, the path may further include a return path for the hardware management robot 110 to take after the identified server farm equipment is replaced. In various embodiments, an interface point complementary to an attachment point of the server farm equipment identified in the service request may be utilized. For example, in some embodiments, the hardware management controller 105, or hardware management robot 110, may determine a corresponding interface point to use by determining an attachment point of the particular server farm equipment. According to a set of embodiments, the hardware management robot 110 may further determine replacement equipment with which to replace the server farm equipment identified in the service request. In some embodiments, the spare equipment repository 115 may indicate the availability of specific replacement equipment, and in response to determining that the specific piece of replacement equipment is available, the hardware management robot 105 may retrieve the replacement equipment from the spare equipment repository. In various embodiments, the hardware management controller 105 or hardware management robot may determine replacement equipment corresponding to the server farm equipment identified in the service request.

Once the hardware management robot 110 reaches the location of the identified server farm equipment, in various embodiments, the hardware management robot 110 may utilize one or more attachments to determine whether the tag, barcode, other label, or unique identifier of a particular piece of server farm equipment matches that of the identified server farm equipment. In some embodiments, the hardware management robots 110 may scan the tag, barcode, or label of server farm equipment. In other embodiments, the hardware management robots 110 may utilize optical character recognition on images or video captured by a camera attachment.

Once the server farm equipment's barcode, tag, label, or unique identifier has been verified, the hardware management robot 110 may utilize its interface point to securely attach to an attachment point of the server farm equipment. The hardware management robot 110 may then remove the server farm equipment, and replace it with replacement equipment. According to one set of embodiments, the hardware management robot 110 may be programmed with a hardware removal and replacement routine through the execution of which server farm equipment may be removed and replaced. In some embodiments, the removal and replacement process may be aided by an attachment, such as a camera, to aid in the alignment process between the interface point and attachment point, and to ensure the interface point is securely coupled to the attachment point. In various embodiments, the operation of the hardware management robot 110 may be manually overridden by a technician or operator of the server farm, where control of the hardware management robot 110 may be aided by use of attachments on the hardware management robot 110.

Upon removal and replacement of the server farm equipment, in various embodiments, the hardware management robot 110 may return the server farm equipment to the failed equipment repository 120. The hardware management robot 110 may tag, label, or otherwise attach an indicator to the recovered server farm equipment indicating diagnostic information, including performance information, equipment health information, problems reported in the service request, or other like information. The indicator may also provide additional identifying information, such as, for example, in situations where the original tag, barcode, or other label associated with the recovered server farm equipment may be associated with the replacement equipment during the replacement process. In various embodiments, the indicator may include a tag or label having alphanumeric characters, symbols, and the like. In other embodiments, the indicator may include an NFC tag, RFID tag, or the like. In additional embodiments, indicator may be a barcode, such as a linear barcode, matrix barcode, 2D barcode, holographic barcode, and the like.

In various embodiments, the path generated by the hardware management controller 105 may include a return path for the hardware management robot 110. The return path may include a path to the failed equipment repository 120, or alternatively the return path may include a path to a drop-off point, where the recovered server farm equipment may be placed for later collection. In some embodiments, the drop-off point may be a point along a conveyor belt, track, or the like upon which the recovered server farm equipment may be placed. The conveyor belt, track, or other like return mechanism may return the recovered server farm equipment to the failed equipment repository 120.

In further embodiments, the return path may include an alternate return path to be taken in the event that other hardware management robots 110 are utilizing the track along the return path. For example, hardware management robot 110a may be deployed to a particular location along the track. Hardware management robot 110b may subsequently be deployed. If, the return path of hardware management robot 110a is obstructed by 110b, the hardware management robot 110a may determine, or be instructed by hardware controller 105, to utilize an alternate return path. In some embodiments, the alternate return path may be a detour utilizing a track segment not utilized by 110b. In other embodiments, the alternate return path in a continuous loop track configuration may involve the traversing the track in the opposite direction of travel than in the original return path. In an alternative embodiment, where a linear track (i.e. start and end points are not connected) is used, the alternate return path may include a diversion along the original return path where the hardware management robot 110a may temporarily remain until hardware management robot 110b no longer obstructs the return path. According to a set of embodiments, the hardware management robots 110 may further be configured to run scheduled thermal checks utilizing a temperature sensor attachment. In various embodiments, the thermal checks may occur on a regular basis, or may automatically be incorporated into any hardware management robot 110 movements, such that the hardware management robot 110 runs thermal scans on server farm equipment as it travels along the track.

Figure 2:
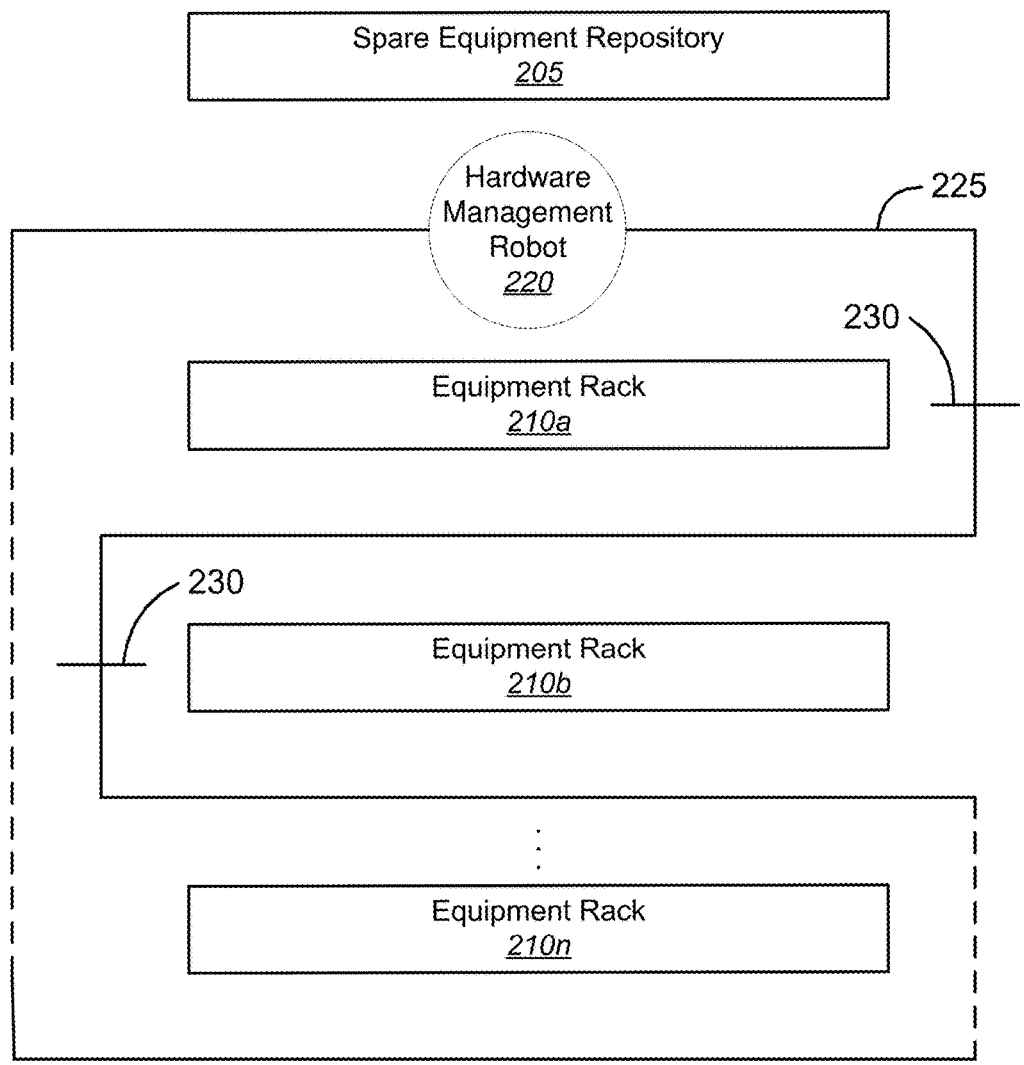
FIG. 2 is a layout for an automated data center, in accordance with various embodiments.

FIG. 2 illustrates a track layout in an automated data center 200, in accordance with various embodiments. The automated data center 200 includes a track 225, placed between equipment racks 210a, 210b, 210n (210 collectively), spare equipment repository 205, and failed equipment repository 215. Hardware management robot 220 may be mounted, attached, or otherwise coupled to track 225, allowing the hardware management robot access to each of the spare equipment repository 205, the equipment racks 210, and failed equipment repository 215. The track 225 may also have one or more junctions to switch between the main track 225 and one or more diversion tracks 230.

According to one set of embodiments, track 225 may be a non-continuous linear track. In other embodiments, the track 225 may be a continuously looped track, where the start and end points are a common point on the track. In various embodiments, the diversion track 230 may be implemented as part of an alternate return path to be utilized in the event that other hardware management robots 220 are utilizing the track along the return path. For example, in some embodiments, hardware management robot 220 may be deployed to server farm equipment located on equipment rack 210a. A second hardware management robot (not pictured) may subsequently be deployed to equipment rack 210b. If, the return path of hardware management robot 220 is obstructed by the second hardware management robot, the hardware management robot 220 may decide to take an alternate return path utilizing diversion track 230. For example, in one embodiment, the hardware robot 220 may be on the track along its return path, between equipment racks 210a and 210b when a second hardware management robot is deployed from a start point located between spare equipment repository and equipment rack 210a. In this situation, the hardware management robot 220 may utilize diversion track 230 on the right side of equipment rack 210a and wait there until the second hardware management robot passes. Once the second hardware management robot has passed, the hardware management robot 220 may resume on its return path. In some embodiments, the hardware management robot 220 may be instructed to take the alternate return path by a hardware management controller. In other embodiments, the hardware management robot 220 may determine itself whether to utilize the alternate return path, such as, for example, when hardware management robot 220 detects that a second hardware management robot is blocking the return path. In another set embodiments, the alternate return path may cause the hardware management robot to traverse the track in the opposite direction of travel than in the original return path. Continuing with the previous example, the hardware management robot 220 may determine that it cannot reach diversion track 230, such as, if the second hardware management robot has already passed the diversion track 230 to the right of equipment rack 210a. In this situation, the hardware management robot 220 may decide to utilize the diversion track 230 to the left of equipment rack 210b until the second hardware management robot passes hardware management robot 220 on the way to equipment rack 210b.

As will be appreciated by those having skill in the art, instead of or in addition to alternate return paths, one or more alternative paths may also be utilized. Thus, in various embodiments, either of hardware management robot 220 or second hardware management robot may utilize diversion tracks 230 or other paths to avoid each other on either of the path to the server farm equipment or return path. In various embodiments, track 225 may be implemented as, without limitation, rail-based tracks; grooves in the floor or ceiling; a guided path such as electrified wire, magnetic tape, or a painted track for optical tracking; and other suitable track configurations. In some embodiments, such as with guided path-type tracks, diversion tracks 230 may be utilized without needing a physical track junction such as, for example, in rail-type track configurations where a hardware management robot 220 must switch between tracks.

Figure 3:
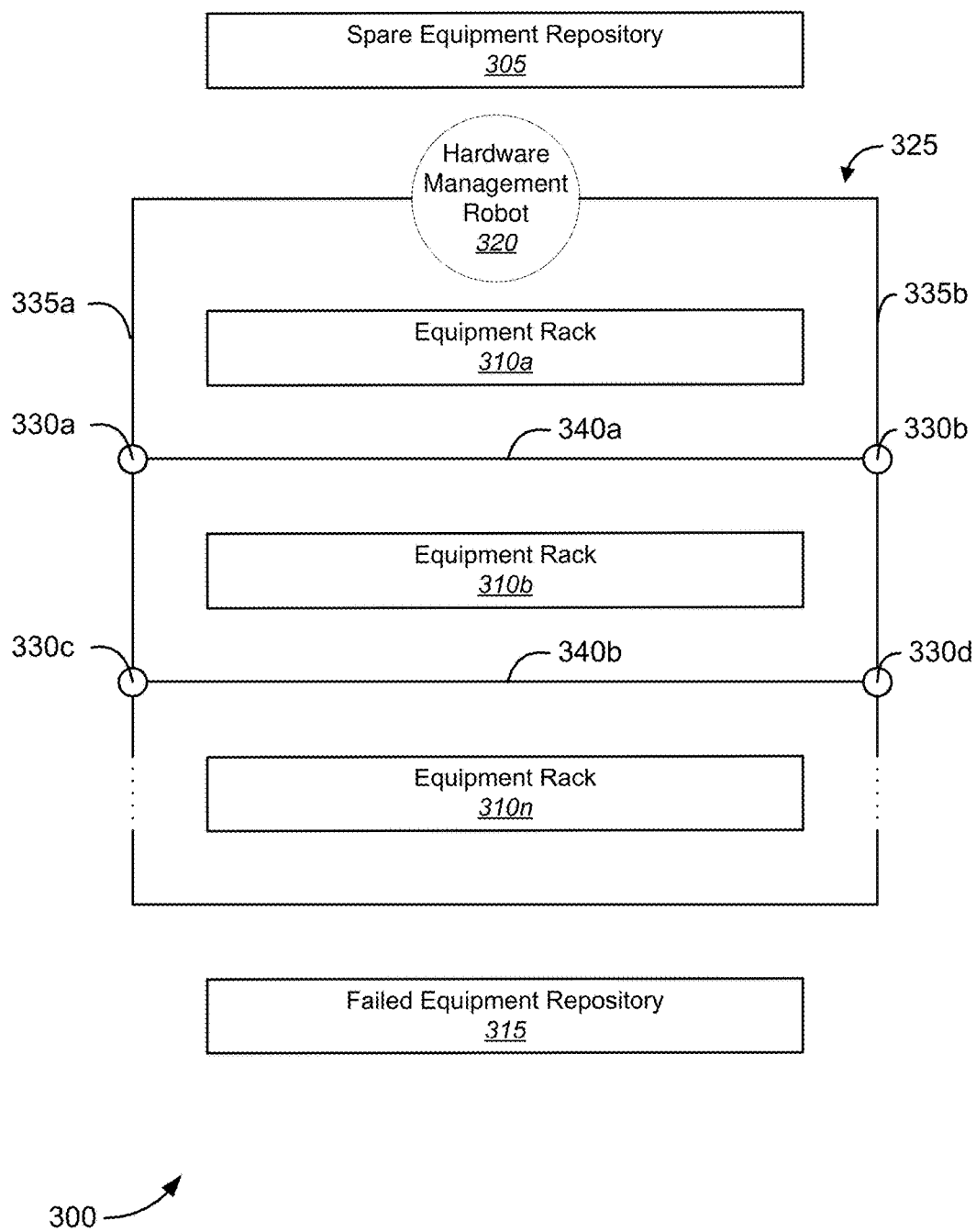
FIG. 3 is an alternative layout for an automated data center, in accordance with various embodiments.

In some alternative embodiments, a trunk and branch architecture track may be utilized. FIG. 3 illustrates a trunk and branch track layout in an automated data center 300, in accordance with various embodiments. The automated data center 300 includes a track 325, placed between equipment racks 310a, 310b, 310n (310 collectively), spare equipment repository 305, and failed equipment repository 315. Hardware management robot 320 may be mounted, attached, or otherwise coupled to track 325, allowing the hardware management robot access to each of the spare equipment repository 305, the equipment racks 310, and failed equipment repository 315. The track 325 may also have one or more junctions 330a, 330b, 330c, 330d (330 collectively) that switch between a main track segments (i.e. trunk) 335a, 335b (335 collectively) and one or more secondary track segments (i.e. branch) 340a, 340b (340 collectively).

According to one set of embodiments, track 325 may be a non-continuous linear track. In other embodiments, the track 325 may be a continuously looped track, where the start and end points are connected. In some embodiments, the secondary track segments 340 may connect two or more main track segments 335. In other embodiments, a secondary track segment 340 may be connected to another secondary track segment 340. In some embodiments, the secondary track segment 340 may extend from a single main track segment 335. In yet further embodiments, a secondary track segment 340 may extend from another secondary track segment 340. One or more junctions 330 may allow a hardware management robot 320 to switch between main track segments 335 and secondary track segments 340, and from a secondary track segment 340 to other secondary track segments 340. According to one set of embodiments, a hardware management controller may operate a switch, remotely or otherwise, the switch being coupled to the junction 330 configured to switch between segments 335, 340 that the hardware management robot 320 traverses. In some embodiments, the track 325 may be a rail-type track, and junction 330 may rely on a rail-type switch. In other embodiments, the track 325 may be a guided path track, and instead of a switch, the hardware management controller may simply instruct the hardware management robot 320 which track to take. In yet further embodiments, the hardware management robot 320 may itself determine which track segment to take at junction 330.

In various embodiments, the several junctions 330 and secondary track segments 340, may be included as part of an alternate return path to avoid other hardware management robots 320 concurrently traversing the same track segment. For example, in one embodiment, the hardware management robot 320 may be deployed to equipment rack 310a. The hardware management controller may generate a path to equipment rack 310a that indicates to the hardware management robot 320 that it should the left main track segment 335a, located to the left of equipment racks 310, and utilize junction 330a to secondary track segment 340a between equipment racks 310a and 310b, to reach the location of server farm equipment on equipment rack 310a. Subsequently, a second hardware management robot (not pictured)

may be deployed to equipment rack 310b, as hardware management robot begins on its return path. In one set of embodiments, the second hardware management robot may be instructed to use the left main track segment 335a to junction 330c, where it will take secondary track segment 340b located between equipment rack 310b and 310n to reach the location of server farm equipment stored on equipment rack 310b. At the same time, the return path of hardware management robot 320 may indicate that secondary track segment 340a should be taken back to junction 330a, to left main track segment 335a to the failed equipment repository 315. In some embodiments, this may cause hardware management robot 320 to block, or be blocked by the second hardware management robot. Therefore, upon determining that second hardware management robot obstructs the return path, the hardware management robot 320 may utilize an alternate return path. In some embodiments, the alternate return path may include utilizing the right main track segment 335b. In other embodiments, one or more secondary track segments 340, main track segments 335, or combination of secondary track segments 340 and main track segments 335 may be utilized to maneuver around other hardware management robots. In various embodiments, the hardware management robot 320 may receive instructions from the hardware management controller to utilize an alternate path. In other embodiments, the hardware robot 320 may itself make the determination as to whether to utilize an alternate path. In further embodiments, the hardware robot 320 may be in communication with the other hardware management robots and, with the other hardware management robots, may avoid collisions and determine which hardware management robot should utilize an alternate path or diversion area. In various embodiments, the alternate path may include multiple alternative paths to the location of particular server farm equipment, and multiple alternative return paths from the location of the server farm equipment to an end point.

Figure 4:
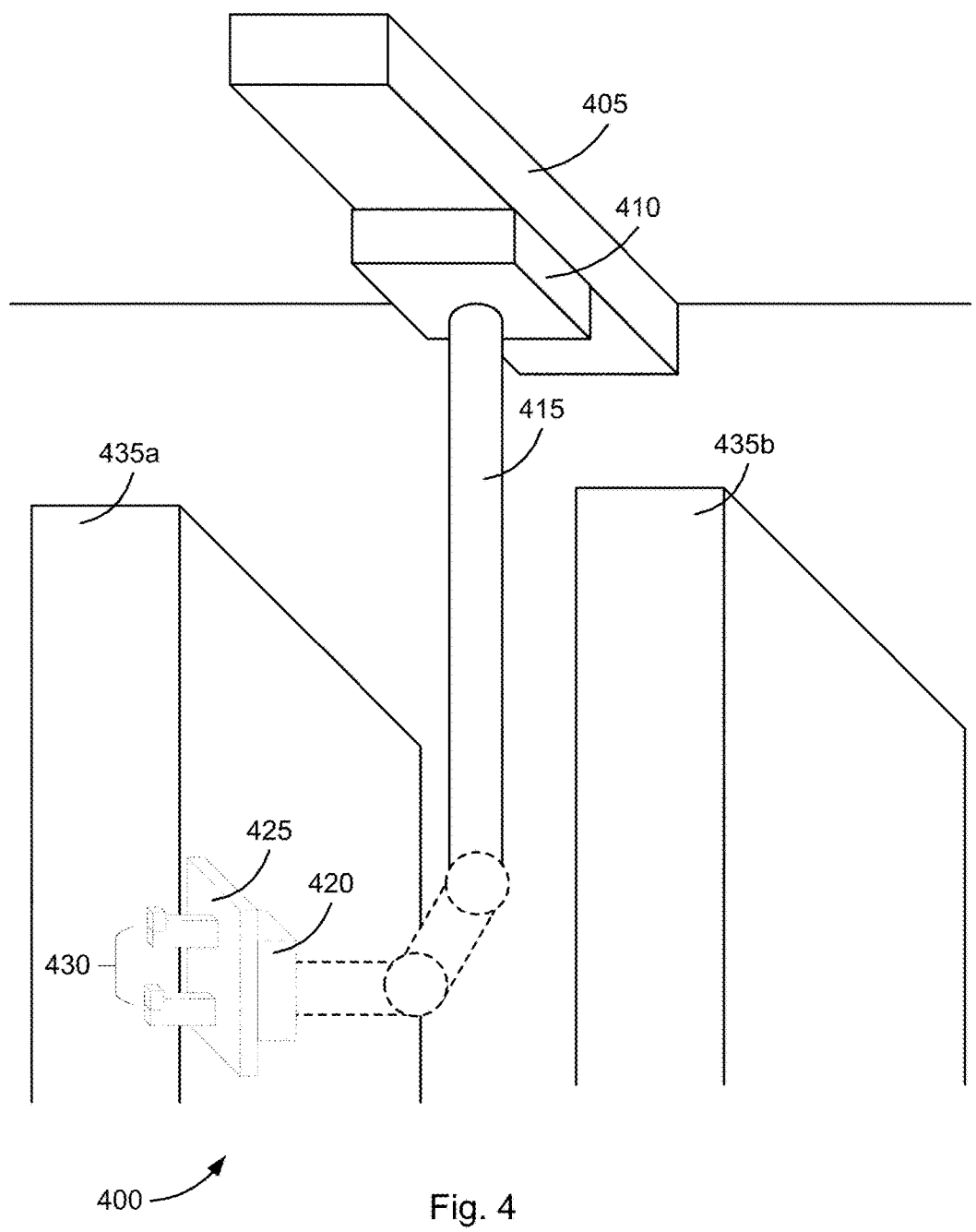
FIG. 4 is a perspective view of a ceiling mounted hardware management robot, in accordance with various embodiments.

FIG. 4 illustrates a perspective view of a ceiling mounted hardware management robot 400, in accordance with various embodiments. The hardware management robot 400 may include, without limitation, a robotic arm 415, and base 410. The hardware management robot 400 may optionally include a turntable, interface connector 420, and interface point 425 including hooks 430. The base 410 may be operably coupled to track 405, and include, without limitation, a drive motor, or other drive mechanism allowing the hardware management robot to move freely on the ground or through the air, or to travel along the track 405. The base 410 may couple to the track 405, without limitation, via wheels, rotors, legs, track-belts, or other similar configurations corresponding to the track type. The track 405 is positioned to allow the hardware management robot 400 to traverse between equipment racks 435a, 435b (collectively 435).

Thus, according to one set of embodiments, the track 405 may be a rail-type track. Base 410 may be coupled to track 405 via rail-wheels powered by a drive motor. In another set of embodiments, the track 405 may be a wire track to which the base 410 attaches via pulley, again powered by the drive motor. It is to be understood that the foregoing examples are provided by way of example only and are not to be interpreted as limiting suitable tracks 405 or coupling systems in any way. In further embodiments, the hardware management robot 400 may include a power system for powering the various systems and components of the hardware management robot 400. In various embodiments, the hardware management robot 400 may receive power from the track 405. For example, in some embodiments, the track 405 may include an electrified rail. In some embodiments, a separate power line may travel alongside, or integrated within the track 405, to which the hardware management robot 400 may be coupled. In other embodiments, the hardware management robot 400 may include a discrete power system delivering power to the hardware management robot 400 independent of external sources such as the track 405. Examples include different types of battery systems, engines, generators, and the like.

Once the hardware management robot 400 reaches the indicated position along the track 405, the robotic arm 415 may then access the server farm equipment at the corresponding equipment rack 435. According to various embodiments, the robotic arm 415 may be operable to extend, grab, attach, or otherwise couple to any type of server farm equipment on either side of an equipment rack 435. The robotic arm may employ servos, motors, geared tracks, pistons, gears, and/or other electro mechanical equipment to articulate and position itself appropriately to attach to server farm equipment wherever it is located on the server rack 435.

According to one set of embodiments, the hardware management robot 400 may include one or more temporary or permanent attachments. The attachments may include a mounted camera, temperature sensors, barcode scanners, and other tools to aid in the management of server farm equipment. In various embodiments, the hardware management robot 400 may utilize attachments to scan server farm equipment barcodes, tags, or labels; measure temperatures, and other health and performance metrics, as part of the replacement process. In further embodiments, the hardware management robot 400 may utilize attachments to aid in the replacement process, as will be discussed in more detail below with respect to FIG. 5.

Figure 5:
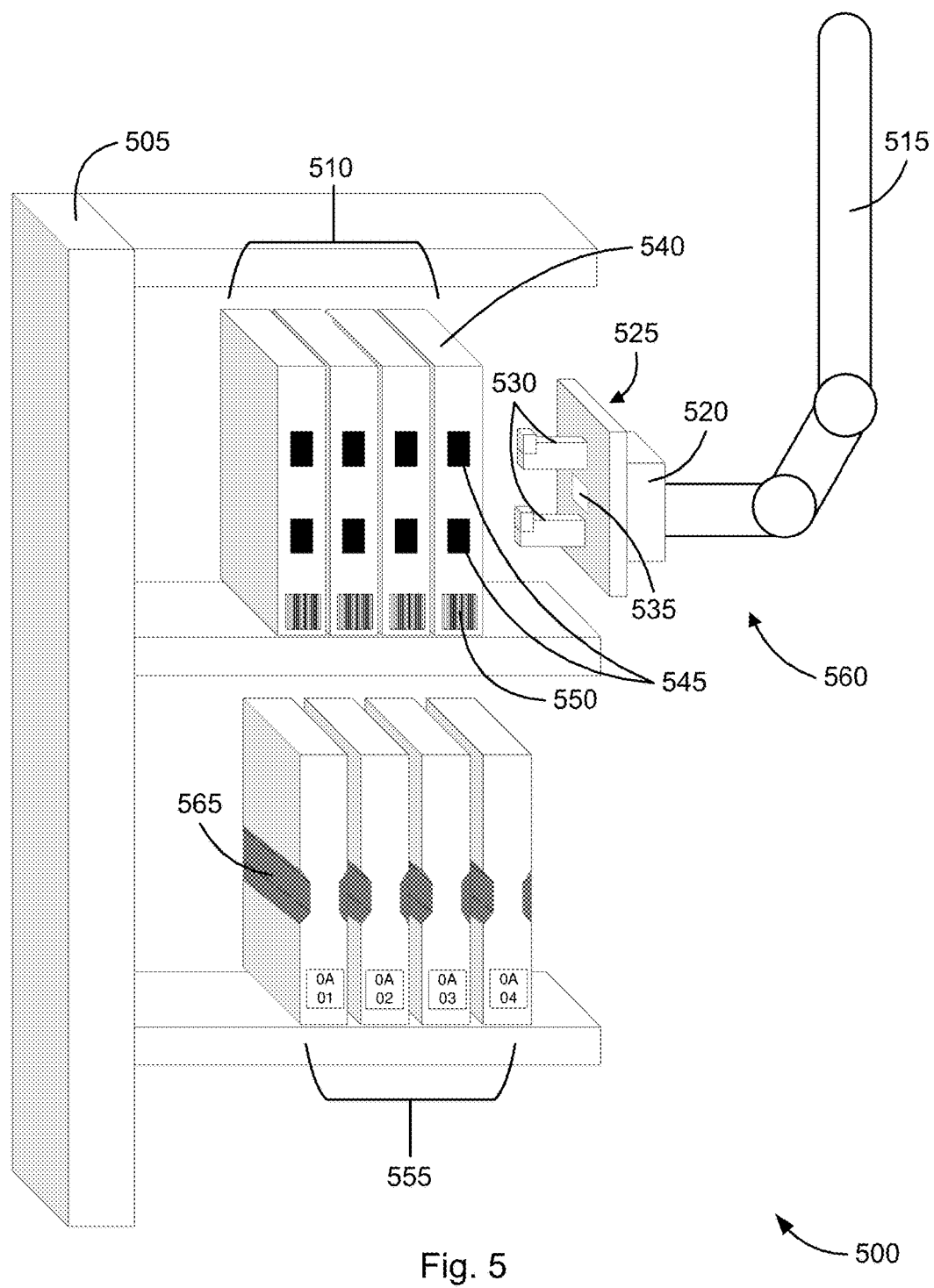
FIG. 5 is a perspective view of a hardware management robot retrieving a server computer, in accordance with various embodiments.

FIG. 5 illustrates a perspective view 500 of a hardware management robot 560 positioned next to server farm equipment 510, 555, in accordance with various embodiments. According to one set of embodiments, equipment rack 505 includes two shelves storing server farm equipment 510, 555. Server farm equipment includes a plurality of server computers 510 mounted to the top shelf of equipment rack 505. Server equipment also includes a plurality of power supplies, and other similar server farm equipment 555 mounted to a bottom shelf of the equipment rack 505. Server computers 510 may include, but are not limited to, blade servers, server cards, and other server computer form factors.

Identified server computer 540 may include one or more attachment points 545, and label 550. As depicted, some embodiments may provide attachment point 545 as a cutout in the server computer face plate for use with corresponding interface point hooks 530. In other embodiments, attachment points may include, without limitation, modifications to the server farm equipment, or an existing physical feature of the server farm equipment. For example, modification may include, but is not limited to, drilling, cutting, molding, bending, polishing, smoothing, sanding, chemically treating, or attaching additional materials and structures. Existing physical features capable of being used as attachment points may include, without limitation, faceplates, housings and casings, external heat sinks, vents, and other like physical features. For example, other server farm equipment 555 may exhibit indentations 565 in its housing that may serve as attachment points.

Hardware management robot 560 may include a robotic arm 515, having on one end an interface connector 520 to which interface point 525 is attached. In one set of embodiments, the interface point 525 may include hooks 530. Attachment 535 may also be attached to hardware management robot 560. In various embodiments, attachment 535 may be coupled to, without limitation, the interface connector, robotic arm 515, interface point 525, a dedicated connector for attachments, or may otherwise be secured to other parts of the body of the robot 560. In various embodiments, the robotic arm 515 may be attached to a base at the end opposite the interface connector 520.

According to one set of embodiments, the base may operably couple the hardware management robot 560 to a track, and include a drive motor, or other drive mechanism, to allow the hardware management robot to traverse the track. Thus, in various embodiments, a hardware management controller may receive a service request, and based on the service request, identify specific server farm equipment, and determine the location of the server farm equipment. For example, the service request may be submitted by a customer utilizing cloud services. The particular service requiring attention may be provided by server computer 540. Thus, based on the request, the hardware management controller may determine a location of server computer 540 and associated equipment rack 505.

In various embodiments, the hardware management controller, or alternatively, the hardware management robot itself 560, may determine the location of server computer 540 based on a unique identifier associated with server computer 540. The unique identifier may further be associated with a tag, barcode, or label 550 attached to server computer 540. In some embodiments, the tag, or label 550 may include, without limitation, alphanumeric characters, symbols, and the like. In other embodiments, the tag may include, without limitation, a near-field communication (NFC) chip, radio frequency (RF) transmitter or receiver, or the like. In additional embodiments, the barcode 550 may include, without limitation, linear barcodes, matrix barcodes, other types of two-dimensional (2D) barcodes, holographic barcodes, and the like. The hardware management controller, or alternatively the hardware management robot 560, may determine an optimal path to reach server computer 540. In various embodiments, the path may be a path through free space, or along a fixed track, as described with respect to FIGS. 2 & 3.

In a one set of embodiments, the tag of the server computer 540 may include a radio frequency identification (RFID) tag 550, each RFID tag including a unique RFID handle. Thus, each server computer of server computers 510 may be assigned a respective RFID handle associated with or acting as a unique identifier. Thus, when a service request is received, the hardware management controller may identify an RFID handle associated with the service request. In various embodiments, the RFID tag may be a powered tag. Thus, a hardware management controller may activate the powered tag. Once activated, the powered tag may broadcast an RF signal of its RFID handle. In various embodiments, a powered tag may receive power directly from server farm equipment with which it is associated with, for example, through a powered universal serial bus (USB) port, or other similar interface of the server farm equipment. Alternatively, the powered tag may be powered by an internal power source, such as a battery, or externally through equipment other than the associated server farm equipment, such as a separate power supply unit.

Based on the broadcasted RF signal, the hardware management robot 560 may determine an appropriate height of the equipment, or shelf of the equipment rack 505 on which the server computer 540 is located. In additional embodiments, multiple tracks may be utilized, each of the tracks fixed at a respective height associated with a respective shelf of the equipment racks 505, allowing hardware management robot 560 to traverse the data center at the level of the selected track. In various embodiments, the hardware management robot 560 may determine and select a track associated with the positioning of server computer 540.

In other embodiments, the RFID tags may be passive components. In such embodiments, the hardware management robot 560 may have to first scan the RFID tags using an RFID reader attachment 535 in order to identify the RFID handle associated with a respective server computer 510. In various embodiments, when the hardware management robot 560 scans the RFID tag, the RFID reader attachment 535 may emit a probing signal which excites the RFID tag, causing the RFID tag to respond with its RFID handle utilizing energy from the probing signal.

Once the hardware management robot reaches server computer 540, the attachment 535 may be used to read label 550 and confirm that the server computer 540 is the same server computer identified in the service request. The attachments 535 may include a mounted camera, temperature sensors, barcode scanners, and other tools to aid in the management of server farm equipment. For example, in some embodiments, the hardware management robot 560 may use a mounted camera, Bluetooth positioning system, radio frequency (RF) based positioning systems, global positioning system, or other sensors, to aid in the navigation of the hardware management robot 560, alignment with the server computer 540 during the attachment process, and monitoring to ensure proper operation and that interface point couples securely to the attachment point 545 of the server farm equipment 540. In some further embodiments, the server farm equipment 510, 540, 555 may include, without limitation, alignment markings, beacons, or other structures to aid in the navigation and attachment process. In other embodiments, an optical camera may provide visual feedback during the alignment and attachment process.

According to one set of embodiments, the operation of the hardware management robot, 560, including during the navigation, attachment, and replacement processes, may be manually overridden, by an operator at the data center. According to another set of embodiments, the controls of the hardware management robot 560 may be manually overridden at the hardware management controller, at a separate control station of the data center or elsewhere on the server farm, or remotely from a separate device. The attachments 535 of the hardware management robot 560 may also independently be controlled, to allow scripted or interactive commands. This functionality may allow an operator, customer, or other interested individuals to inspect server farm equipment, or location within the data center. In yet further embodiments, the hardware management robot 560 may be used to conduct other maintenance activities, including, but not limited to, activities such as validating a cable connection or inspecting cable integrity.

According to one set of embodiments, the hardware management robot 560 may include an interface point 525 coupled to interface connector 520. The interface point 525 may include an interchangeable "hand" as a physical interface to the target server farm equipment. In various embodiments, the interface connector 520 may be operable to support a plurality of different interface point 525 types. For example, interface point 525 may include, without limitation, hooks, powered screwdrivers, clamps, suction cups, fingers or prongs, magnets, and other appropriate tools for securely attaching to attachment point(s) 545 of server farm equipment 510, 555, 540. According to one set of embodiments, the hardware management robot may choose specific interface points 525, based on server farm equipment identified in the service request. Thus, continuing with the previous example, in one set of embodiments, the hardware management controller, or hardware management robot 560, may determine that server computer 540 uses tabs cut into a face plate as its attachment points 545. Thus, the hardware management robot 560 may utilize a hook-type interface point 525 that corresponds to tab-type attachment points 545. Thus, the hooks 530 of hook-type interface point 525, correspond to the tabs of tab-type attachment point 545, where the hooks 530 may be inserted into the tab-type attachment point 545 for secure attachment. In some further embodiments, the interface point 525 may also include a protective layer, such as cushioning, to prevent the attachment point 545 surface from being damaged by the interface point 525 surface.

In a further set of embodiments, the hardware management robot 560, in addition to, or in combination with removing server farm equipment, may be operable to remove connections to and from various pieces of server farm equipment. For example, the connections may include, without limitation, various cables, connectors, and power cords. In one set of embodiments, a server computer 540 may be coupled to one or more server switches 555 via a plurality of cables. In various embodiments, the cables, connectors, or power cords may include latching tabs, or other locking mechanisms to secure the cable or connector to a respective jack or port. Accordingly, the hardware management robot 560 may utilize a clamp-type interface point 525 to connect or disconnect the cables, connectors, and power cords from the server farm equipment. For example, in one set of embodiments, the server computer 540 may be coupled to one of the server switches 555 via an Ethernet cable. The Ethernet cable may utilize an RJ45 plug having a latching tab. Thus, the clamp-type interface point may be used to depress the latching tab of the RJ45 plug, thus releasing RJ45 plug from the corresponding Ethernet port and allowing the Ethernet cable to be removed. In some further embodiments, the clamp-type interface point 525 may be configured to remove multiple cables simultaneously. For example, in various embodiments, connections to the server computer 540, or from server switches 555, may include groupings of four, eight, sixteen, twenty-four, or thirty-two cables or connectors. Thus, the clamp-type interface point 525 may include two laterally elongated jaw portions arranged to simultaneously secure and depress the latching tabs of a grouping of adjacent cables or connectors for both connection and disconnection of the cables or connectors.

Once the server computer 540 is removed, various embodiments may, without limitation, call for one or more storage trays, slots, bins, or other like storage structures with which the hardware management robot 560 may place removed server farm equipment. In further embodiments, the hardware management robot 560 may also store replacement equipment in the one or more storage trays, slots, or bins. In yet further embodiments, the hardware management robot 650 may comprise multiple robotic arms. Some of the robotic arms may be reserved for removing server farm equipment 510, 540, 555 and holding the removed server farm equipment, while others of the robotic arms may be utilized to hold replacement server farm equipment and to mount the replacement server farm equipment on the equipment rack 505, in place of the removed server farm equipment. In some embodiments, the hardware management robot 560 may attach a new tag, barcode, label, other indicator on the removed server farm equipment. The hardware management robot 560 may also, similarly, attach a new tag, barcode, label, or other indicator on the replacement server equipment. Alternatively, in some embodiments, the hardware management controller, or hardware management robot 560, may update an inventory of the server farm or data center to reflect the changes in equipment and corresponding identifiers of the equipment.

Figure 6:
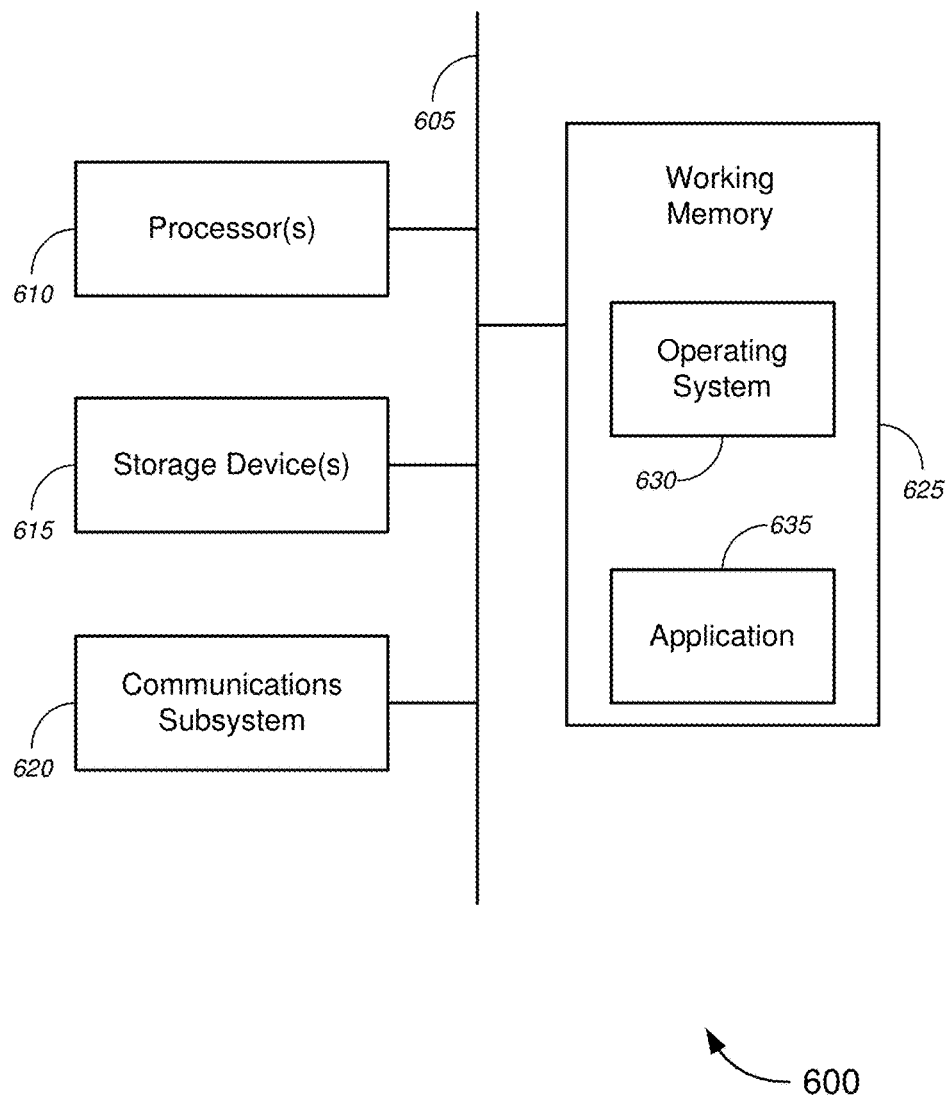
FIG. 6 is a block diagram of a computer architecture for a hardware management controller, in accordance with various embodiments.

FIG. 6 is a block diagram of an exemplary computer architecture 600 that may be used for server farm hardware management, in accordance with various embodiments. FIG. 6 provides a schematic illustration of one embodiment of a computer system 600 that can perform the methods provided by various other embodiments, as described herein, and/or can perform the functions of the hardware management controller, hardware management robot, or any other computer systems as described above. It should be noted that FIG. 6 is meant only to provide a generalized illustration of various components, of which one or more (or none) of each may be utilized as appropriate. FIG. 6, therefore, broadly illustrates how individual system elements may be implemented in a relatively separated or integrated manner.

The computer system 600 includes a plurality of hardware elements that can be electrically coupled via a bus 605 (or may otherwise be in communication, as appropriate). The hardware elements may include one or more processors 510, including, without limitation, one or more general-purpose processors and/or one or more special-purpose processors (such as digital signal processing chips, graphics acceleration processors, and/or the like).

The computer system 600 may further include, or be in communication with, one or more storage devices 615. The one or more storage devices 615 can comprise, without limitation, local and/or network accessible storage, or can include, without limitation, a disk drive, a drive array, an optical storage device, a solid-state storage device. The solid-state storage device can include, but is not limited to, one or more of a random access memory ("RAM") or a read-only memory ("ROM"), which can be programmable, flash-updateable, or the like. Such storage devices may be configured to implement any appropriate data stores, including, without limitation, various file systems, database structures, or the like.

The computer system 600 might also include a communications subsystem 620, which can include, without limitation, a modem, a network card (wireless or wired), a wireless programmable radio, or a wireless communication device. Wireless communication devices may further include, without limitation, a Bluetooth device, an 802.11 device, a WiFi device, a WiMax device, a WWAN device, cellular communication facilities, or the like. The communications subsystem 620 may permit data to be exchanged with a customer premises, residential gateway, integrated residential gateway, authentication server, walled garden, or combination of the above elements, as described above. Communications subsystem 620 may also permit data to be exchanged with other computer systems, and/or with any other devices described herein, or with any combination of network, systems, and devices. According to some embodiments, the network might include a local area network ("LAN"), including without limitation a fiber network, or an Ethernet network; a wide-area network ("WAN"); a wireless wide area network ("WWAN"); a virtual network, such as a virtual private network ("VPN"); the Internet; an intranet; an extranet; a public switched telephone network ("PSTN"); an infra-red network; a wireless network, including without limitation a network operating under any of the IEEE 802.11 suite of protocols, the Bluetooth protocol, or any other wireless protocol; or any combination of these or other networks.

In many embodiments, the computer system 600 will further comprise a working memory 625, which can include a RAM or ROM device, as described above. The computer system 600 also may comprise software elements, shown as being currently located within the working memory 625, including an operating system 530, device drivers, executable libraries, and/or other code. The software elements may include one or more application programs 635, which may comprise computer programs provided by various embodiments, and/or may be designed to implement methods and/or configure systems provided by other embodiments, as described herein.

By way of example, one or more procedures described with respect to the methods discussed herein might be implemented as code and/or instructions executable by a computer (and/or a processor within a computer). In an aspect, such code and/or instructions can be used to configure and/or adapt a general purpose computer (or other device) to perform one or more operations in accordance with the described methods.

A set of these instructions and/or code might be encoded and/or stored on a non-transitory computer readable storage medium, such as the storage device(s) 615 described above. In some cases, the storage medium 615 might be incorporated within a computer system 600. In other embodiments, the storage medium might be separate from the computer system 600, in the form of a removable medium, such as an optical disc, USB flash drive, or the like. In some embodiments, the storage medium might be provided in an installation package, such that the storage medium can be used to program, configure, and/or adapt a general purpose computer with the instructions/code stored thereon. These instructions might take the form of executable code, which is executable by the processor(s) 600 and/or might take the form of source and/or installable code. The source or installable code, upon compilation, installation, or both compilation and installation, on the computer system 600 might take the form of executable code. Compilation or installation might be performed using any of a variety of generally available compilers, installation programs, compression/decompression utilities, or the like.

It will be apparent to those skilled in the art that substantial variations may be made in accordance with specific requirements. For example, customized hardware—such as programmable logic controllers, field-programmable gate arrays, application-specific integrated circuits, and/or the like—might also be used. In some cases, particular elements might be implemented in hardware, software (including portable software, such as applets, etc.), or both. Further, connection to other computing devices such as network input/output devices may be employed.

As mentioned above, in one aspect, some embodiments may employ a computer system 600 to perform methods in accordance with various embodiments of the invention. According to a set of embodiments, some or all of the procedures of such methods are performed by the computer system 600 in response to processor 610 executing one or more sequences of one or more instructions. The one or more instructions might be incorporated into the operating system 630 and/or other code that may be contained in working memory 625, such as an application program 635. Such instructions may be read into the working memory 625 from another computer readable medium, such as one or more of the storage device(s) 615. Merely by way of example, execution of the sequences of instructions contained in the working memory 625 might cause the processor(s) 610 to perform one or more procedures of the methods described herein.

The terms "machine readable medium" and "computer readable medium," as used herein, refer to any medium that participates in providing data that causes a machine to operation in a specific fashion. In one set of embodiments, various computer readable media might be involved in providing instructions/code to processor(s) 610 for execution, might be used to store and/or carry such instructions/code such as signals, or both. In many implementations, a computer readable medium is a non-transitory, physical, and/or tangible storage medium. Such a medium may take many forms, including, but not limited to, non-volatile media, volatile media, and transmission media. Non-volatile media includes, for example, optical disks, magnetic disks, or both, such as the storage device(s) 615. Volatile media includes, without limitation, dynamic memory, such as the working memory 625. Transmission media includes, without limitation, coaxial cables, copper wire and fiber optics, including the wires that comprise the bus 505, as well as the various components of the communication subsystem 620, and/or the media by which the communications subsystem 620 provides communication with other devices. Hence, transmission media can also take the form of waves, including, without limitation, radio, acoustic, and/or light waves, such as those generated during radio-wave and infra-red data communications.

Common forms of physical or tangible computer readable media include, for example, a floppy disk, a flexible disk, a hard disk, magnetic tape, or any other magnetic medium; a CD-ROM, DVD-ROM, or any other optical medium; punch cards, paper tape, or any other physical medium; a RAM, a PROM, an EPROM, a FLASH-EPROM, or any other memory chip or cartridge; a carrier wave; or any other medium from which a computer can read instructions or code.

Various forms of computer readable media may be involved in carrying one or more sequences of one or more instructions to the processor(s) 610 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 600. These signals, which might be in the form of electromagnetic signals, acoustic signals, optical signals and/or the like, are all examples of carrier waves on which instructions can be encoded, in accordance with various embodiments of the invention.

The communications subsystem 620 (and/or components thereof) generally will receive the signals, and the bus 605 then might carry the signals (and/or the data, instructions, etc. carried by the signals) to the working memory 625, from which the processor(s) 610 retrieves and executes the instructions. The instructions received by the working memory 625 may optionally be stored on a storage device 615 either before or after execution by the processor(s) 610.

According to a set of embodiments, the computer system 600 may have access to, and be in communication with, one or more diagnostic and management tools. The computer system 600 may receive a service request, via the communications subsystem 620, from one or more of the diagnostic and management tools, or a data center operator. The computer system 600 may also be in communication with one or more hardware management robots. The computer system 600 may include computer readable media, having stored thereon a plurality of instructions, which, when executed by the processor 610, allows the computer system 600 to determine an identity of particular server farm equipment associated with the service request. Based on the identity of the particular server farm equipment, the computer system 600 may, in some embodiments, generate a path to the server farm equipment. The computer system 600 may then transmit the path to one or more hardware management robots. In various embodiments, the computer system 600 may additionally be in communication with a spared equipment repository and failed equipment repository.

Figure 7A:
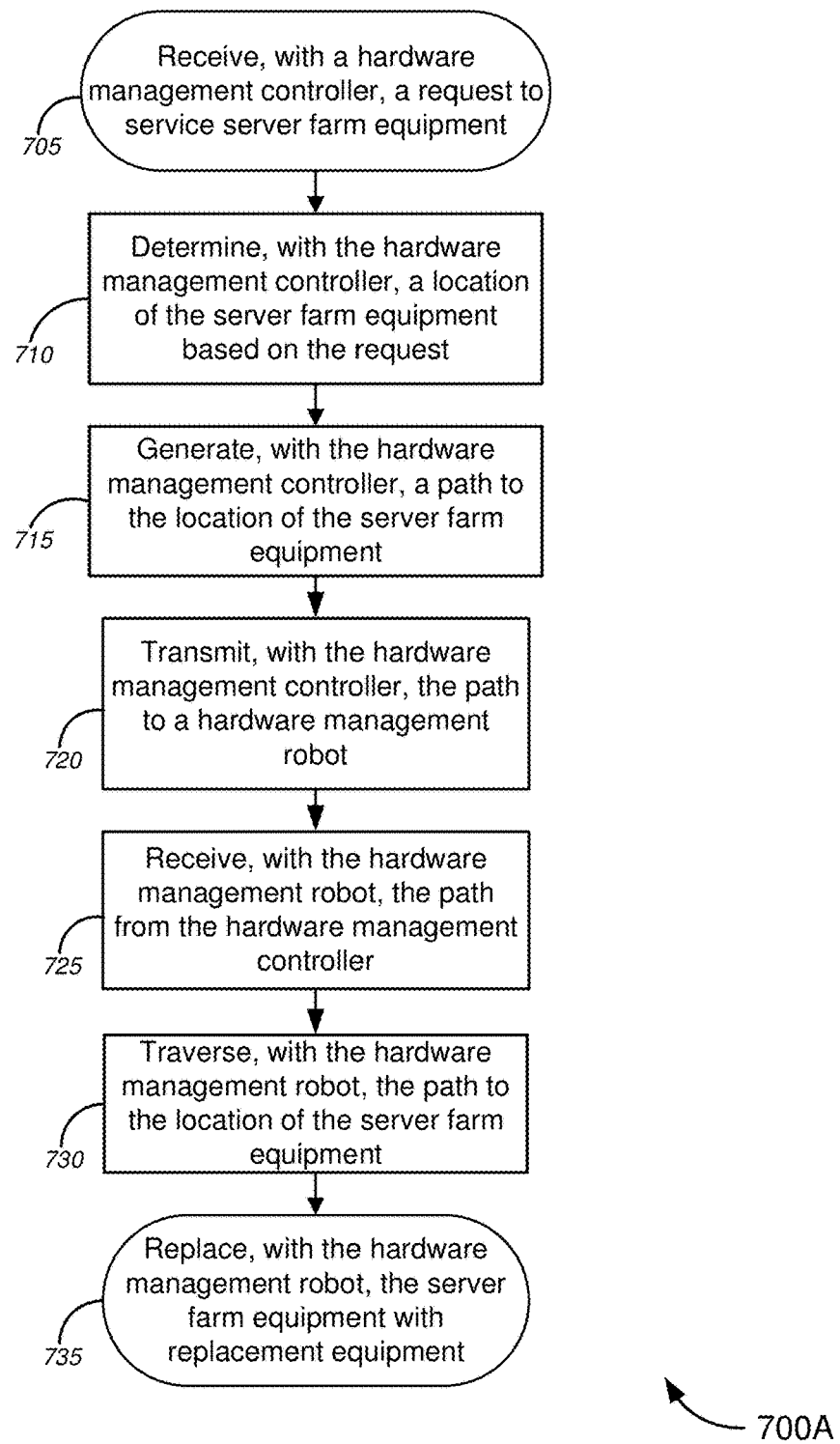
FIG. 7A is a flow diagram of a method for automated management of a data center.

FIG. 7A illustrates a flow diagram of a method 700A for automated data center management, in accordance with various embodiments. The method begins, at block 705, by receiving, with a hardware management controller, a request to service server farm equipment. In various embodiments, the hardware management controller may be in communication, over a network, with various client devices, diagnostic tools, server farm operator devices, and the like. The service request may identify one or more services, associated customers, diagnostic information, and the like.

At block 710, based on the service request, the hardware management controller may determine a location of the associated server farm equipment. According to one set of embodiments, the controller may first identify the server farm equipment based on the service request. For example, specific server far equipment may be identified based on the services, customers, or diagnostic information contained in the service request. In various embodiments, the hardware management controller may further determine a unique identifier associated with identified server farm equipment, or a barcode, tag, or other label associated with the server farm equipment. Based on the unique identifier, barcode, tag, or other label, the hardware management controller may then determine the location of the server farm equipment. In yet further embodiments, the location may be determined based on location information. Location information may include, without limitation, geographic coordinates, equipment rack identifier, and position on an equipment rack At block 715, a path to the location of the server farm equipment is generated by the hardware management controller. In various embodiments, hardware management robots may be mounted to a track in the data center. In other embodiments, the hardware management robots may be airborne, or travel freely over ground. Therefore, in various embodiments, depending on whether a track is used, and if a track is used, what type of track is used, the path may be a series of geographic coordinates, waypoints, or directions for the hardware management robot to follow.

At block 720, the path is transmitted by the hardware management controller to a hardware management robot. Correspondingly, at block 725, the hardware management robot receives the path from the hardware management controller. In various embodiments, the hardware management controller may be in communication with one or more hardware management robots, either directly or over a network connection. Similarly, each of the hardware management robots may be in further communication with one another, as well as with other systems located remotely, on the data center, or elsewhere on server farm.

At block 730, the hardware management robot traverses the path to the location of the server farm equipment. In accordance with various embodiments, the hardware management robots may include, but are not limited to, robotic arms, wheeled robots, rotary and other airborne robots, walking-type robots, continuous-track robots (i.e. track-belt driven), or other robotic devices capable of physically navigating to a location specified by the location information, and removing and replacing server computers or other equipment from an equipment rack. In various embodiments, the hardware management robot may correspond to the type of track used in the data center or server farm. Tracks may include, but are not limited to, rail-based tracks, grooves in the floor or ceiling, a guided path such as electrified wire or magnetic tape (capable of being followed by the hardware management robots).

At block 735, the server farm equipment is replaced with replacement equipment by the hardware management robot. In various embodiments, the hardware management robot may have an interface point corresponding to an attachment point of the identified server farm equipment. In some embodiments, the hardware management robot may scan a barcode, tag, or other label of the server farm equipment to confirm that is matches the server farm equipment identified in the service request. The identified server farm equipment may then be removed by the hardware management robot, and replaced with replacement equipment. In further embodiments, the hardware management robot may assign a new tag, barcode, or label to the removed server farm equipment for identification purposes.

Figure 7B:
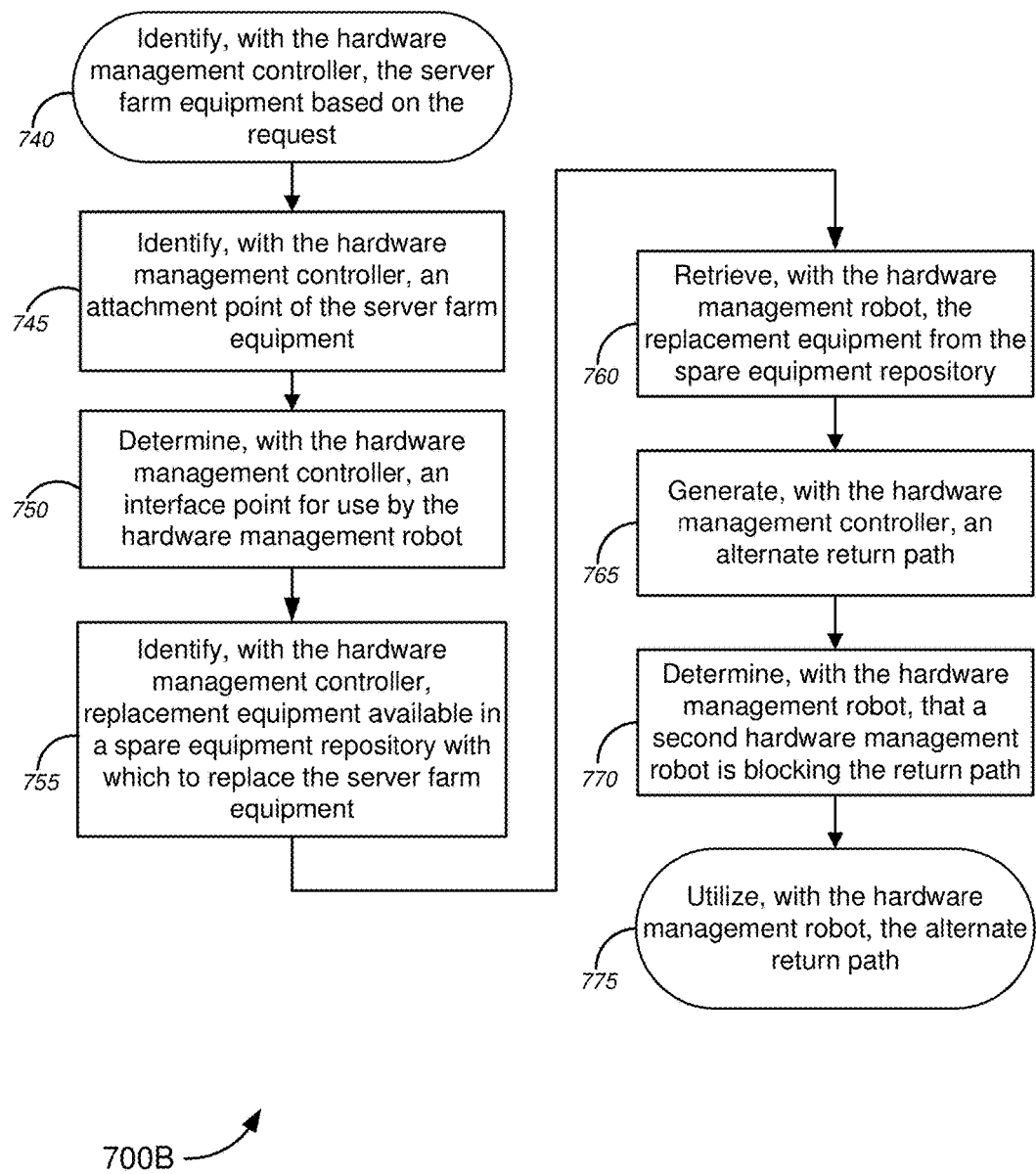
FIG. 7B is a flow diagram of a method for additional procedures in the automated management of a data center.

FIG. 7b is a flow diagram of a method 700B for additional operations that may be executed in combination with method 700A. The method begins, at block 740, by identifying the server farm equipment based on the service request. As discussed above, with respect to FIG. 7A, the hardware management controller may identify server farm equipment based on the service request.

At block 745, the hardware management controller may identify an attachment point associated with the identified server farm equipment. In various embodiments, the attachment points may include, without limitation, modifications to the server farm equipment, or an existing physical feature of the server farm equipment. For example, modification may include, but is not limited to, drilling, cutting, molding, bending, polishing, smoothing, sanding, chemically treating, or attaching additional materials and structures. Existing physical features capable of being used as attachment points may include, without limitation, faceplates, housings and casings, external heat sinks, vents, and other like physical features.

At block 750, the hardware management controller may determine an interface point for use by the hardware management robot, corresponding to the attachment point of the identifier server farm equipment. In various embodiments, the interface point may include an interchangeable "hand," allowing the hardware management robot to reach, grab, attach, couple, or otherwise physically interact with the server farm equipment being replaced. The interface point of a hardware management robot may include, without limitation, hooks, screwdrivers, clamps, suction cups, magnets, fingers, and other like structures.

At block 755, the hardware management controller may identify replacement equipment that is available in a spare equipment repository, with which to replace the server farm equipment. In various embodiments, the spare equipment repository may be in communication with the hardware management controller and capable of providing inventory information to the hardware management controller. In various embodiments, updates to the inventory may be transmitted in real-time, accessible on-demand, or follow a programmed schedule.

At block 760, the hardware management robot may then retrieve the identified replacement equipment from the spare equipment repository. In various embodiments, the hardware management robot may also be in communication with the spare equipment repository. The spare equipment repository may similarly comprise an equipment rack storing a plurality of spare equipment. The spare equipment may also each be associated with a unique identifier, tag, barcode, or label. The hardware management controller may also generate a path to the replacement equipment for the hardware management robot to take to the spare equipment in the spare equipment depository. In various embodiments, the spare equipment repository may be one or more equipment racks, or a designated area within or separate from the server farm.

At block 765, the hardware management controller may generate multiple paths to the identified server farm equipment, and multiple return paths from the identified server farm equipment. In various embodiments, an optimal return path may be generated, along with one or more alternate return paths to be transmitted to the hardware management robot.

At block 770, the hardware management robot may determine that a second hardware management robot is blocking its path. In various embodiments, the hardware management robot may be in communication with other hardware management robots, and may thus determine whether any other hardware management robots will be in its path. In other embodiments, the hardware management robot may use one or more of its attachments, as described above with respect to FIGS. 4 and 5, to detect other hardware management robots that may be in its way. In yet another embodiment, the hardware management controller may instruct or otherwise inform the hardware management robot of the presence of the second hardware management robot. At block 775, the hardware management robot may then utilize the alternate return path to avoid other hardware management robots. In various embodiments, the hardware management robot may select a "next-best" path to utilize as an alternate return path.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added, and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. An automated data center management system, comprising:
    one or more equipment racks, each equipment rack configured to house at least one server farm equipment, each of the at least one server farm equipment having an attachment point;
    a spare equipment repository having at least one replacement equipment; and
    a first hardware management robot comprising a robotic arm having an interface point, the interface point configured to couple to the attachment point of the at least one server farm equipment;
    a hardware management controller in communication with the first hardware management robot, the hardware management controller comprising:
    at least one processor;
    non-transitory computer readable media having encoded thereon computer software comprising a set of instructions executable by the at least one processor to cause the hardware management controller to:
        receive a service request, wherein the service request indicates server farm equipment needing service;
        determine a location of the server farm equipment;
        determine whether one or more objects are located between the first hardware management robot and the server farm equipment;
        generate a path from the first hardware management robot to the location of the server farm equipment, wherein the path that is generated takes into account a location of each of at least one of the one or more objects that are determined to be located between the first hardware management robot and the server farm equipment;
        transmit information regarding the path to the first hardware management robot;
    wherein, in response to receiving the information regarding the path, the first hardware management robot is configured to follow the path to the server farm equipment and to replace the server farm equipment with replacement equipment of the at least one replacement equipment.

2. The system of claim 1, wherein the automated data center management system further comprises a track, wherein the first hardware management robot is operably coupled to the track to move along the track.

3. The system of claim 2, wherein the track is coupled to a ceiling of a data center.

4. The system of claim 2, wherein the track is coupled to a floor of a data center.

5. The system of claim 2, wherein the track is a looped track, and wherein the track comprises one or more track junctions that join a main segment of the track to at least one secondary segment of the track, wherein each track junction is configured to allow the first hardware management robot to select whether to traverse the main segment or one or more of the at least one secondary segment.

6. The system of claim 1, wherein the path includes a return path from the location of the server farm equipment, wherein the path further includes an alternate return path configured to allow the first hardware management robot to avoid obstructions along the return path.

7. The system of claim 6, wherein the alternate return path guides the first hardware management robot to a conveyor belt position, wherein the conveyor belt is configured to carry recovered equipment to a failed equipment service area.

8. The system of claim 6, wherein the first hardware management robot is in communication with at least one second hardware management robot, and wherein the first hardware management robot determines the alternate return path based on communication from the at least one second hardware management robot.

9. The system of claim 1, wherein the first hardware management robot is in communication with at least one second hardware management robot, and wherein the first hardware management robot determines an alternate path to the location of the server farm equipment based on communication from the at least one second hardware management robot.

10. The system of claim 1, wherein the interface point is chosen from a set of interchangeable interface points including at least one of a screw-type, a magnetic-type, a suction-type, a hook-type, a finger-type, or a clamp-type interface point.

11. The system of claim 1, wherein the set of instructions executable by the at least one processor further causes the hardware management controller to identify, based at least in part on the service request, replacement equipment among the at least one replacement equipment available in the spare equipment repository with which to replace the server farm equipment.

12. The system of claim 1, wherein the set of instructions executable by the at least one processor further causes the hardware management controller to create an indicator with which to tag recovered equipment.

13. The system of claim 1, wherein the server farm equipment is associated with at least one of a tag, a barcode, or a label, wherein the first hardware management robot is further operable to read the at least one of the tag, the barcode, or the label to identify the server farm equipment.

14. The system of claim 13, wherein the at least one of the tag, the barcode, or the label comprises a radio frequency identification handle or near-field communication chip.

15. A method for automating a data center, comprising:
  receiving, with a hardware management controller, a request to service server farm equipment;
  determining, with the hardware management controller, a location of the server farm equipment;
  determining, with the hardware management controller, whether one or more objects are located between a hardware management robot and the server farm equipment;
  generating, with the hardware management controller, a path from the hardware management robot to the location of the server farm equipment, wherein the path that is generated takes into account a location of each of at least one of the one or more objects that are determined to be located between the hardware management robot and the server farm equipment;
  traversing, with the hardware management robot, the path to the location of the server farm equipment; and
  replacing, with the hardware management robot, the server farm equipment with replacement equipment.

16. The method of claim 15, further comprising:
  identifying, with the hardware management controller, replacement equipment available in a spare equipment repository with which to replace the server farm equipment; and
  retrieving, with the hardware management robot, the identified replacement equipment from the spare equipment repository.

17. The method of claim 15, wherein the path includes a return path from the location of the server farm equipment, wherein the method further comprises:
  generating, with the hardware management controller, an alternate return path configured to allow the hardware management robot to avoid obstructions along the return path;
  determining, with the hardware management robot, that an obstruction is blocking the return path; and
  traversing, with hardware management robot, the alternate return path in response to determining that the return path is blocked.

18. An automated data center hardware management controller, comprising:
  at least one processor;
  non-transitory computer readable media having encoded thereon computer software comprising a set of instructions executable by the at least one processor to cause the automated data center hardware management controller to:
    receive a service request, wherein the service request indicates server farm equipment needing service;
    determine a location of the server farm equipment;
    determine whether one or more objects are located between a hardware management robot and the server farm equipment;
    generate a path from the hardware management robot to the location of the server farm equipment, wherein the path that is generated takes into account a location of each of at least one of the one or more objects that are determined to be located between the hardware management robot and the server farm equipment;
    transmit information regarding the path to the hardware management robot.

19. The automated data center hardware management controller of claim 18, wherein the set of instructions executable by the at least one processor further causes the hardware management controller to identify, based at least in part on the service request, an identifier of the server farm equipment needing service, wherein the location of the server farm equipment is determined based on the identifier of the server farm equipment.

20. The automated data center hardware management controller of claim 18, wherein the set of instructions executable by the at least one processor further causes the hardware management controller to identify replacement equipment available in a spare equipment repository with which to replace the server farm equipment.

* * * * *